United States Patent

Burns et al.

[11] Patent Number: 4,603,304
[45] Date of Patent: Jul. 29, 1986

[54] REFERENCE FREQUENCY GENERATION FOR SPLIT-COMB FREQUENCY SYNTHESIZER

[75] Inventors: Robert E. Burns, Veradale, Wash.; Thomas L. Grisell, Palo Alto, Calif.; Fred H. Ives, Veradale, Wash.

[73] Assignee: Hewlett-Packard Company, Palo Alto, Calif.

[21] Appl. No.: 625,472

[22] Filed: Jun. 27, 1984

[51] Int. Cl.[4] ............................................. H03L 7/00
[52] U.S. Cl. ........................................ 331/2; 331/22; 331/23; 331/25; 331/31; 332/19; 455/76; 455/113
[58] Field of Search .................... 331/2, 22, 23, 25, 31; 332/19; 455/76, 113

[56] References Cited

U.S. PATENT DOCUMENTS

4,388,597 1/1983 Bickley et al. ........................... 331/2

Primary Examiner—James B. Mullins
Assistant Examiner—James C. Lee
Attorney, Agent, or Firm—Leslie G. Murray

[57] ABSTRACT

A frequency synthesizing apparatus of the closed-loop design employing a first frequency mixing means to provide a continuous constant increment frequency coverage over a given output signal frequency range. The first frequency mixing means is responsive to the output signal and a first reference signal to provide a first difference signal both when the output signal frequency is higher than and lower than the first reference signal frequency. A frequency comparison means is responsive to the first difference signal and to an input signal, the input signal being continuously variable over a given input frequency range, to provide a first error signal for controlling the output frequency and stabilizing the closed loop. The first reference signal is comprising of a plurality of predetermined, selectable frequencies provided by a phase-locked loop employing a second frequency mixing means. The second frequency mixing means is responsive to the first reference signal and a plurality of predetermined, selectable second reference signals to provide a second difference frequency. Phase comparison means responsive to the second difference frequency and to a third reference signal provides a second error signal to control the frequency of the first reference signal and to lock the phase-locked loop when the frequency of the first reference signal frequency is either the sum of the second and third reference signal frequencies or the difference between the second and third reference signal frequencies.

14 Claims, 7 Drawing Figures

REFERENCE FREQUENCY GENERATION FOR SPLIT-COMB FREQUENCY SYNTHESIZER

BACKGROUND OF INVENTION

The invention relates generally to the art of frequency synthesizing and more particularly to frequency synthesizers utilizing a phase locked loop including a frequency conversion mixer.

It is well known in the art to synthesize frequencies by means of phase-locked loop circuits. The phase-locked loop (PLL) includes a tunable oscillator (typically a voltage-controlled oscillator (VCO)) whose output is locked to a known reference signal by means of a phase comparator. The phase comparator generates an output voltage or current that is proportional to the phase difference between the two signals. The phase comparator output is fed back to the input of the VCO and used to tune the VCO. This forces the VCO output to have exactly the same frequency as the reference signal. By interposing a divide-by-N block in the circuit comparator, the reference frequency may instead be compared with the VCO frequency divided by N; the VCO output will then be locked to N times the reference frequency. By varying N, it is possible to generate frequencies which are the Nth harmonics of the reference frequencies, where N is an integer. Another technique, called fractional N, makes it possible to generate frequencies that are any rational multiple of the reference frequency. Such a technique is disclosed in U.S. Pat. No. 3,928,813 issued to Charles A. Kingsford-Smith on Dec. 23, 1975, entitled "Device for Synthesizing Frequencies which are Rational Multiples of a Fundamental Frequency".

Utilization of a frequency mixing (frequency addition and subtraction) means in a phase-locked loop to synthesize selected output frequencies is also well-known in the art. The use of a series of stepping or reference frequencies with such a PLL will provide a continuous constant increment frequency coverage over a given output frequency ($F_{out}$) range. Typically, such frequency synthesizers utilize a series of stepping frequencies ($F_{step}$) equal to N times a reference frequency ($F_{ref}$) where N is an integer. To avoid frequency discontinuities over a given output range, $F_{ref}$ must be equal to or less than the difference between the highest and lowest input frequencies ($F_{in}$) applied to the PLL. This relationship can be expressed as follows:

$$F_{ref} \leq (f_b - f_a)$$

where $f_b$ and $f_a$ are the high and low input frequencies, respectively. The range of $F_{in}$ typically covers an octave, i.e., $f_b = 2f_a$. Also, it is typically desired that $F_{out}$ cover an octave, i.e., $f_2 = 2f_1$, where $f_2$ and $f_1$ are the high and low output frequencies, respectively. The goal of such a PLL is generally to translate the characteristics of a range of input frequencies to higher frequencies in the range of the reference frequency. The condition $f_b = 2f_a$ is necessary for complete phase-locked coverage over the range of $F_{out}$ in loops of the type discussed herein.

One technique for the generation of the stepping frequencies utilizes a harmonic frequency generator in combination with selective filters. However, the minimum necessary frequency separation between adjacent stepping frequencies to provide continuous constant increment frequency coverage over the synthesizer output frequency range makes it difficult to filter out unwanted frequencies resulting in the injection of spurious signals into the PLL. Furthermore, the generation of stepping frequencies becomes significantly more difficult and expensive as the frequency of the desired synthesizer output increases. Frequency division is the only technique other than frequency mixing to generate $F_{out}$ at a higher frequency than $F_{in}$; however, frequency division produces noise in $F_{out}$ which is the divide ratio times any noise in $F_{in}$.

U.S. Pat. No. 3,902,132 issued to Raymond L. Fried on Aug. 26, 1975, entitled "Closed Loop Variable Frequency Signal Generator", discloses a frequency synthesizer comprising a phase-locked loop utilizing a frequency mixing circuit and a series of stepping frequencies to provide a selected range of output frequencies. Fried discloses a loop that can both add and subtract $F_{in}$ to and from $F_{ref}$, hence requiring fewer reference frequencies than prior art synthesizers which synthesized $F_{out}$ by either adding or subtracting $F_{in}$ to or from $F_{ref}$. Further, the required reference frequencies need be separated by $2f_a$ rather than $f_a$ as utilized in prior art synthesizers. (Where $f_a$ and $f_b$ are the low and high frequencies respectively of $F_{in}$ and $f_b = 2f_a$.) $F_{ref}(F_{step})$ is a combination of frequencies represented by the equation:

$$F_{ref} = \sum_{n=0}^{n=\infty} nf_b.$$

The appropriate signal is selected by a tunable filter; the wider the spacing of the reference signals, the easier it is to filter out unwanted signals thereby reducing spurious noise at the synthesizer output. The technique disclosed by Fried utilizes four reference (stepping) frequencies to cover one octave at the synthesizer output.

SUMMARY OF THE INVENTION

In accordance with the preferred embodiment, the present invention provides a phase-locked loop comprising a frequency mixing means, a band pass filter, phase detector and voltage controlled oscillator (VCO). The input signal ($F_{in}$) to the PLL is variable over a range of 45–90 MHz and is provided by a PLL utilizing the Fractional N technique described in U.S. Pat. No. 3,928,813. The frequency mixer outputs the difference frequency between the frequency at the output of the PLL and a series of reference or stepping frequencies ($F_{ref}$). The output of the frequency mixer and $F_{in}$ are compared by the loop phase detector which provides an error signal to the VCO to lock the PLL. The reference frequencies ($F_{ref}$) are provided by a frequency mixing circuit which outputs the sum and difference frequencies derived from mixing the outputs $F_{saw}$ of a plurality of high-Q resonant oscillators with an FM reference frequency ($F_{FM}$). Two sets of three reference frequencies spaced $f_a$ ($f_a = 45$ MHz) apart provide a PLL output range of 500 to 1,000 MHz.

The present invention takes advantage of the reduced circuit complexity and reduced noise and spurs inherent in the utilization of fewer reference frequencies at closer frequency spacing. $F_{saw}$ is generated by locking a high-Q resonant oscillator in a narrow bandwidth loop to a timebase reference rather than by broadband multiplication or harmonic generation. Therefore, noise at offsets greater than the lock bandwidth is merely the noise of the free running, high-Q oscillator rather than the noise of the timebase multiplied by a high number. The circuit complexity and filtering requirements are reduced because fewer reference signals are generated and hence fewer spurs. Further, since the references available at any one time are widely separated ($6f_a$ apart), filtering requirements are further reduced.

DESCRIPTION OF THE PREFERRED EMBODIMENT

Figure 1:
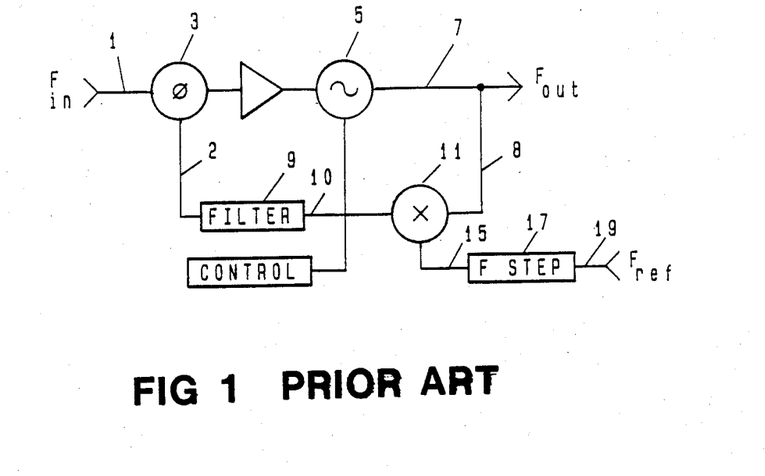
FIG. 1 is a simplified block diagram of a prior art frequency conversion circuit, illustrating the operation of a phase-locked loop responsive to a series of stepping frequencies.

Referring to FIG. 1, a simplified block diagram of a prior art phase-locked loop frequency synthesizer, as described in U.S. Pat. No. 3,902,132, issued to Raymond L. Fried, is shown. A predetermined range of input frequencies, $F_{in}$, is input to the phase detector 3 on line 1. The range of input frequencies has low and high limits of $f_a$ and $f_b$, respectively, and is typically supplied by a previous PLL synthesizer circuit. The reference frequency, $F_{ref}$, on line 19 drives a stepping frequency source 17 which generates a series of stepping frequencies, $F_{step}$. $F_{step}$ is applied via line 15 to one input of a frequency mixer 11, and a portion of the VC0 5 output frequency, $F_{out}$, on line 7 is applied via line 8 to the frequency mixer 11. The mixer 11 produces sum and difference frequencies between the signals applied on lines 8 and 15, which sum and difference frequencies are applied to a low-pass filter 9 via line 10. The low-pass filter applies the difference frequency on line 2 to the phase detector 3. The phase detector 3 compares the phase of the respective input signals and generates a dc signal proportional in magnitude to the phase difference between the input signals which is applied to the input of the VCO 5. The loop will stabilize when the difference frequency between $F_{out}$ on line 8 and $F_{step}$ on line 15 is equal to the frequency of the input signal, $F_{in}$, on line 1.

Typically prior art synthesizes $F_{step}$ by setting up a comb of frequencies, $Nf_a$; $F_{out}$ was then synthesized by either adding or subtracting $F_{in}$ to or from $F_{step}$. The difference frequency applied to the phase detector 3 on line 2 is the absolute frequency difference between $F_{step}$ and $F_{out}$. Fried discloses a PLL in which $F_{in}$ can be both added to and subtracted from $F_{step}$, thus a single stepping frequency may be used to generate either of two output frequencies for a given input frequency. The reference comb now need only have stepping frequencies spaced at $2f_a$ rather than $f_a$ as was required by prior art.

Figure 2:
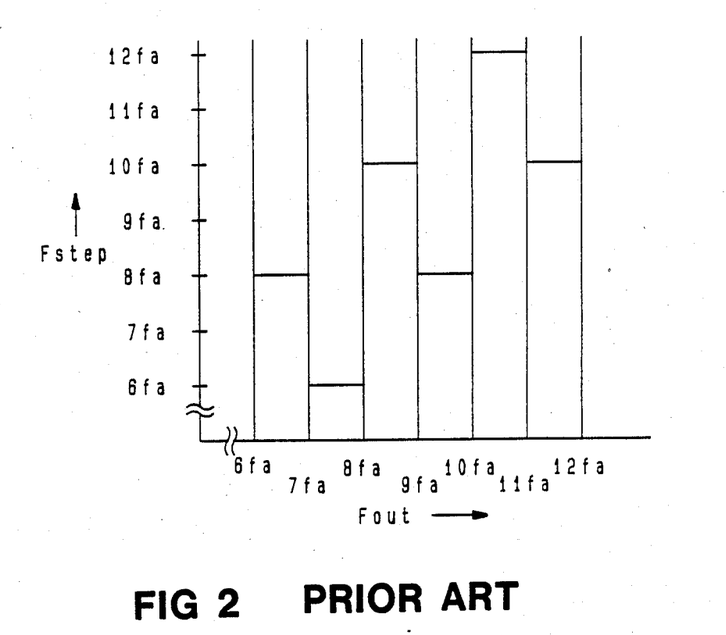
FIG. 2 is a frequency distribution chart for the prior art illustrating the continuous constant increment output frequency coverage for successive stepping frequencies relative to a specified range of input frequencies.

FIG. 2 illustrates the output frequency coverage when a single stepping frequency $F_{step}$ is used to cover two independent output frequency range bands. Again, $f_b = 2f_a$ and $F_{ref} \leq f_a$ (line 19, FIG. 1). Each frequency in one band of the output is higher in frequency than $F_{step}$ by the value of the input frequencies, and each frequency in the other band is lower in frequency than $F_{step}$ by the value of the input frequencies. For example, with a stepping frequency of $8f_a$, and an input frequency range of $f_a$ through $f_b$ ($2f_a$), the respective bands of the output frequency range covered are $6f_a$ through $7f_a$, and $9f_a$ through $10f_a$. Thus a total of four stepping frequencies are required to continuously cover an output frequency range of one octave.

Figure 3:
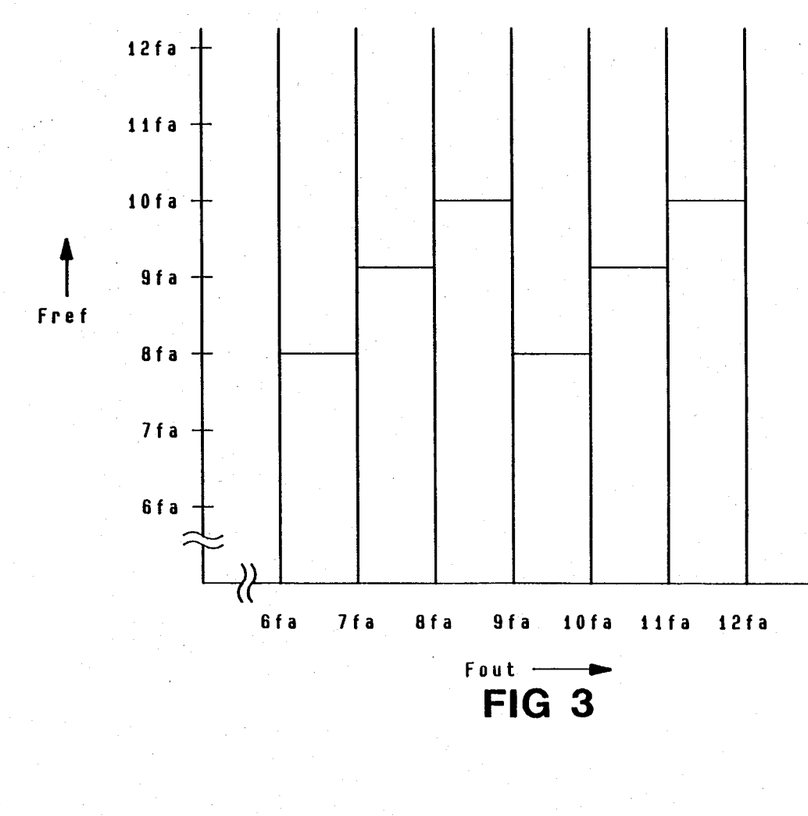
FIG. 3 is a frequency distribution chart for the circuit of the present invention illustrating the continuous constant increment output frequency coverage for selected reference frequencies relative to a specified range of input frequencies.

FIG. 3 illustrates that the output frequency range of one octave can be continuously covered utilizing just three references with a spacing of $f_a$. Three reference frequencies is the absolute minimum number required to cover an octave of $F_{out}$ continuously if the input frequency range is limited to one octave (i.e., $f_b = 2f_a$). For example, a given reference frequency, $F_{ref}$, will provide two bands of $F_{out}$ with two gaps between these two bands: $F_{ref} - f_a$ to $F_{ref}$ and $F_{ref}$ to $F_{ref} + f_a$. Two additional reference frequencies at $F_{ref}$ plus $f_a$ and at $F_{ref}$ minus $f_a$ are required to cover the two gaps, hence a minimum of three reference frequencies will provide continuous coverage over an octave of $F_{out}$.

Figure 4:
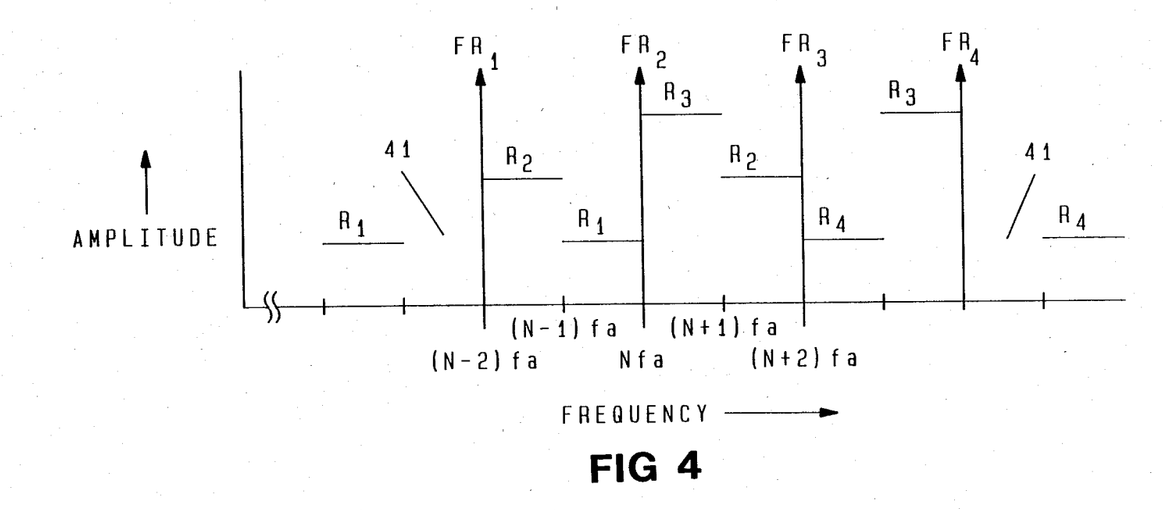
FIG. 4 is a frequency distribution chart as seen on a spectrum analyzer for the prior art illustrating the continuous constant increment output frequency coverage for selected reference frequencies.
Figure 5:
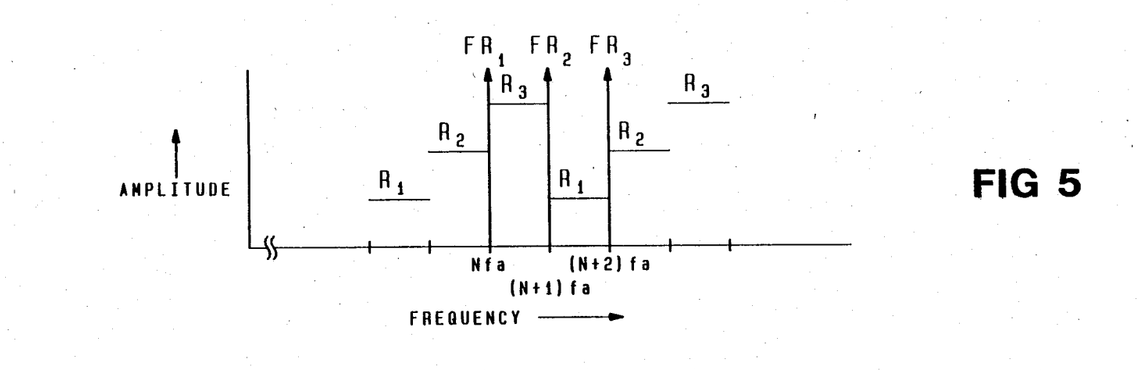
FIG. 5 is a frequency distribution chart as seen on a spectrum analyzer for the circuit of the present invention illustrating the continuous constant increment output frequency coverage for selected reference frequencies.
Figure 7:
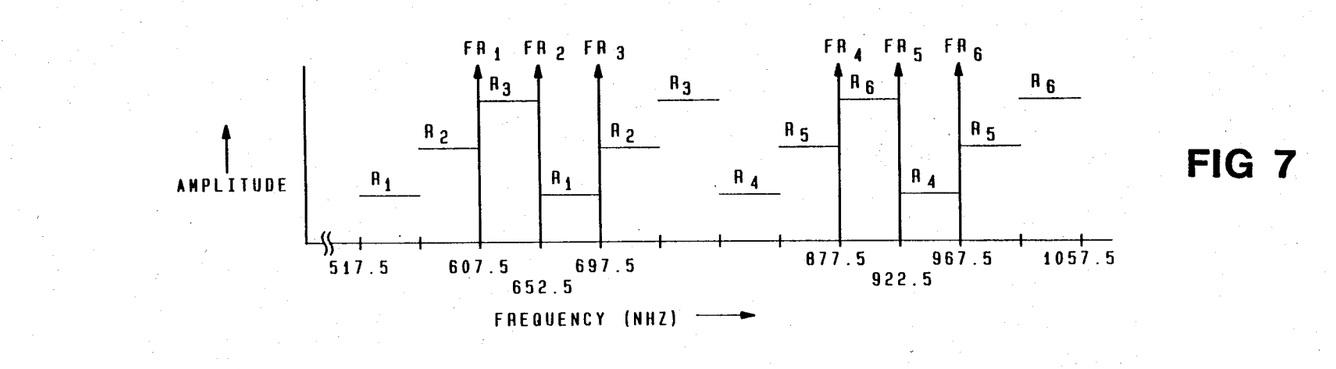
FIG. 7 is a frequency distribution chart as seen on a spectrum analyzer illustrating the output frequency for selected reference frequencies.

FIGS. 4 and 7 are frequency distribution charts that would be observed on a spectrum analyzer illustrating output frequency coverage provided by selected reference frequencies. The vertical line labeled $F_{R2}$, for example, represents the reference frequency which covers the two output frequency bands represented by the horizontal lines labeled $R_2$. Referring now to FIG. 4, if $N=8$, the approach utilized by Fried requires four reference frequencies to cover an octave of output frequency, $6f_a$ to $12f_a$. Further, a lock band at each end of the octave, separate from the range of continuous coverage by a gap 41, is not utilized. Referring now to FIG. 5, if $N=8$, the three reference frequencies $F_R$, $F_{R2}$ and $F_{R3}$ continuously cover an octave of output frequency, $6f_a$ to $12f_a$, in six bands. The horizontal lines labeled $R_1$ represent the two frequency bands covered by the reference frequency $F_{R1}$. Utilizing this approach, there are no unused frequency bands or gaps in coverage and the same frequency range is covered utilizing three references rather than the four references required by the prior art.

In the preferred embodiment of the present invention, it is desired that the output frequency, $F_{out}$, cover an octave, a range of approximately 500 MHz to 1,000 MHz. Additionally, it may be desirable to provide an output signal with frequency modulation (FM) capability. Since it is simpler to FM a fixed frequency rather than a variable frequency signal covering an octave, $F_{ref}$ rather than $F_{in}$ is utilized as the FM reference signal. Further, to get the best trade-off between noise and FM performance, it is desirable to FM a signal in the 50

MHz to 150 MHz range. The FM reference signal ($F_{FM}$) must be upconverted to the 500 MHz to 1,000 MHz range by another signal in that frequency range prior to entering it into the output PLL as $F_{REF}$.

The upconversion process may be accomplished by frequency mixing providing two FM reference signals at any one time: the sum and difference signals at the output of the upconversion mixer. To make the most efficient use of the generated FM references, both sidebands of the mixer must be utilized. Therefore, the number of reference frequencies used as $F_{REF}$ will be a multiple of 2. Since the number of reference frequencies required for continuous coverage of an octave of $F_{out}$ is 3, the minimum number of reference frequencies required then, is 6 to take advantage of the above mentioned effects.

Figure 6:
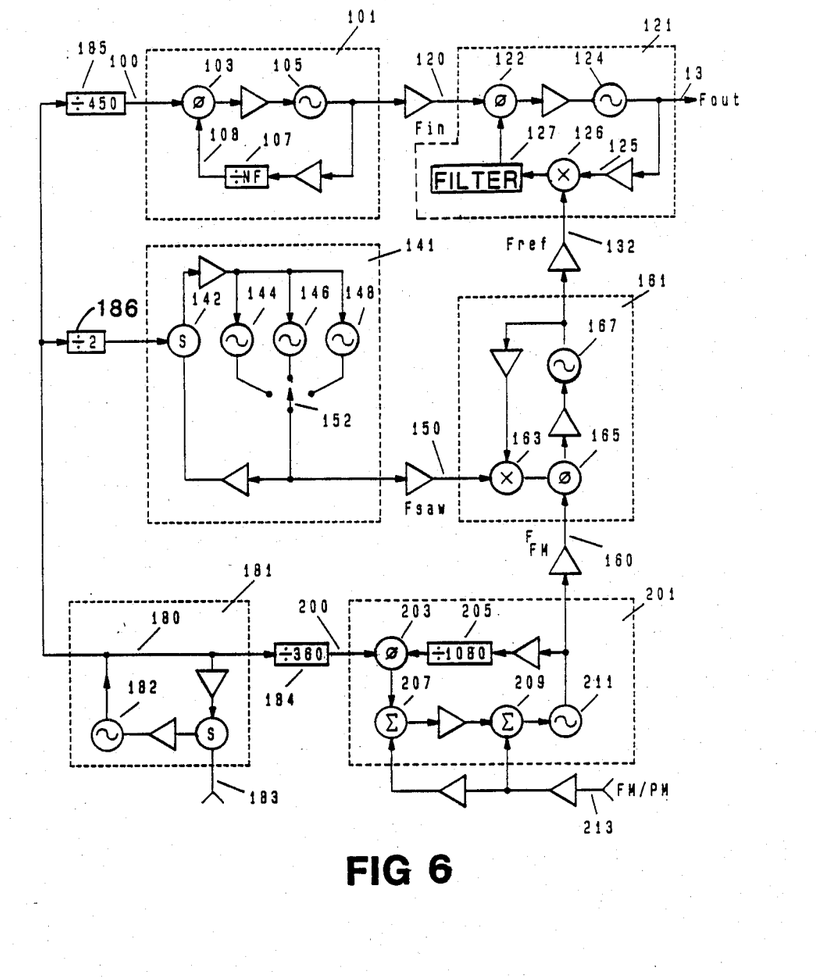
FIG. 6 is a block diagram of the preferred embodiment illustrating the operation of the frequency circuit and the generation of the reference frequencies.

FIG. 6 is a detailed block diagram illustrating the implementation of the preferred embodiment. The output frequency, $F_{out}$, covers an approximate range of 500 MHz to 1,000 MHz utilizing six reference frequencies, $F_{REF}$. The $F_{REF}$ are the sum and difference frequencies resulting from mixing an FM reference frequency, $F_{FM}$, with the outputs, $F_{saw}$, of three high-Q resonant oscillators. The PLL input frequency, $F_{in}$, is synthesized in another PLL utilizing the fractional-N technique disclosed in U.S. Pat. No. 3,928,813, and is tunable over the range of 45 MHz to 90 MHz ($f_a=45$ MHz and $f_b=90$ MHz).

Referring now to FIG. 6, the time base loop 181 comprises a crystal oscillator 182 which provides a standard frequency $F_s$ of 45 MHz. The oscillator 182 may be locked to an external time base input on line 183. The time base signal $F_s$ is then used as a reference signal in a plurality of loops to generate the various signals required by the output PLL 121. The FM reference PLL 201 synthesizes $F_{FM}$ at a frequency of 135 MHz. $F_s$ on line 180 is frequency divided in divider block 184 and utilized as a reference signal at the phase detector 203 input line 200. The phase of the output of VCO 211 via frequency divider block 205 is compared to the reference signal on line 200 to provide an error signal which locks the loop to the desired $F_{FM}$. External or internal FM or phase modulation signals on line 213 may be summed into the loop at summers 207 or 209 to provide an FM reference signal to the output PLL 121. $F_{FM}$ is entered into the reference clean-up PLL 161 at the phase detector 165 input 160.

UHF reference block 141 generates three UHF reference frequencies, $F_{saw}$, and comprises three high-Q oscillators 144, 146 and 148 (such as a surface acoustic wave resonator oscillator) and electronic switch 152. The oscillators 144, 146 and 148 are locked to the time base by synchronizer circuit 142 and divider block 186. The desired $F_{saw}$ is selected by the operator via microprocessor control (not shown) of switch 152 and is output on line 150. The reference clean-up loop 161 comprises a PLL utilizing a frequency mixing circuit. A portion of the output of VCO 167 is mixed in frequency mixer 163 with $F_{saw}$ on line 150 to produce the sum and difference frequencies of the two signals. The phase of the difference frequency via a low pass filter (not shown) is compared with the phase of $F_{FM}$ on line 160 by phase detector 165 to provide an error signal to VCO 167 which locks the loop to $F_{saw}+F_{FM}$ or $F_{saw}-F_{FM}$. The output, $F_{REF}$, of the reference clean-up loop 161 is utilized as the reference (stepping) frequency in the output PLL 121 and is input to the frequency mixer 126 on line 132. Since there are three $F_{saw}$'s generated by the UHF reference block 141 and both sidebands are used, the reference clean-up loop 161 generates six $F_{REF}$'s to the output PLL.

The time base signal $F_s$ on line 180 is also utilized as the reference frequency for the input frequency PLL 101. $F_s$ via frequency divider 185 is input on line 100 to phase detector 103. The output of the VCO 105 is frequency divided by the fractional-N block 107 and the input to the phase detector 103 via line 108. The phase of the signal on line 108 is compared to the phase of $F_s$ on line 100 to provide an error signal to the VCO 105 to lock the loop to a predetermined frequency. The PLL 101 is tunable over the range 45 MHz to 90 MHz. The output signal $F_{in}$ of the PLL 101 is applied to the output PLL 121 on line 120.

The output PLL 121 comprises a tunable oscillator 124, such as a VCO, a frequency mixing circuit 126, a low pass or bandpass filter 127 and a phase detector 122. A portion of the output of the VCO 124 is input to mixer 126 on line 125. The sum and difference frequencies of the signal on line 125 and $F_{REF}$ on line 132 is provided by mixer 126 to the low pass or bandpass filter 127. The output of the low pass or bandpass filter 127, which is the difference frequency from mixer 126, is applied to the phase detector 122. $F_{in}$ on line 100 is applied to the other input of the phase detector 122. Phase detector 122 compares the phase of the two signals and generates an error signal, the magnitude of which is proportional to the phase difference of the two signals. The error signal is then applied to the VCO 124 to adjust the output frequency of the VCO 124 and lock the loop to the desired frequency. Since the difference frequency provided by mixer 126 is the absolute difference between $F_{out}$ and $F_{REF}$, the loop will lock to either $F_{REF}+F_{in}$ or to $F_{REF}-F_{in}$. An initial control signal is applied to the VCO 124 by control circuitry (not shown) to pre-tune the VCO 124 to the vicinity of the desired frequency at which it will be operating for a selected output frequency.

Referring now to FIG. 7, the two groups of vertical lines represent the six reference frequencies, $F_{REF}$, generated by the reference clean-up loop (161, FIG. 6). The centers of the two groups of $F_{REF}$ are 270 MHz or 2 $F_{FM}$ apart. The exact $F_{saw}$ frequencies are chosen to minimize noise and spurious signals. Selecting one $F_{saw}$ at a time, there exists only two $F_{REF}$'s at any one time: $F_{R1}$ and $F_{R4}$, $F_{R2}$ and $F_{R5}$, or $F_{R3}$ and $F_{R6}$. Since these pairs are separated by $2F_{FM}$, the filtering is much simpler. $F_{out}$ from the output PLL (121, FIG. 6) covers a range of 517.5 MHz to 1,057.5 MHz in twelve tunable bands. For example, the horizontal lines labeled $R_2$ represent the tunable bands provided by $F_{REF}$ represented by $F_{R2}$.

We claim:

1. A closed loop frequency synthesizer for generating a final output signal having a frequency which is selectively tunable over an output frequency range, said frequency synthesizer comprising:

frequency generating means for producing the final output signal having a frequency determined by the level of a control input signal;

first frequency mixing means having first and second inputs, said first input coupled to said frequency generating means;

a first phase-locked loop coupled to said second input of said first frequency mixing means, said first phase-locked loop including a voltage controlled oscillator for providing a first reference signal, second frequency mixing means having first and second inputs, said first input of said second frequency mixing means coupled to said voltage controlled oscillator, and a first phase detector having first and second inputs, said first input of said first phase detector coupled to said second frequency mixing means, a first signal source means coupled to said second input of said first phase detector, said first signal source means for providing an FM reference signal to said first phase detector, a second signal source means coupled to said second input of said second frequency mixing means, said second signal input of said second frequency mixing means, said second signal source means for providing a second reference signal having a plurality of predetermined, selectable frequencies, said second frequency mixing means responsive to the first reference signal and the second reference signal to provide a first difference signal, said first difference signal indicative of the frequency difference between said first reference signal and said second reference signal, said first phase detector responsive to the FM reference signal and to the first difference signal to provide a first error signal, said first error signal indicative of a phase difference between said FM reference signal and said first difference signal means, coupling said first phase detector to the voltage controlled oscillator, said voltage controlled oscillator responsive to said first error signal to adjust the frequency of the first reference signal, the first phase-locked loop being stabilized when said first difference signal frequency is equal to the FM reference signal frequency, said first phase-locked loop may be stabilized when the first reference signal frequency is equal to the sum of the second reference signal frequency and the FM reference signal frequency, and also when the first reference signal frequency is equal to the difference between the second reference signal frequency and the FM reference signal frequency;

a second phase-locked loop for providing an input signal having a multiplicity of frequencies, said multiplicity of frequencies being rational multiples of a third reference signal frequency, said multiplicity of frequencies selectable over an input frequency range, said input frequency range defined by a lower frequency and an upper frequency;

frequency comparison means having a first input coupled to said first frequency mixing means and a second input coupled to said second phase-locked loop, said first frequency mixing means responsive to the first reference signal and the final output signal for providing a second difference signal, said second difference signal having a frequency equal to the difference between said first reference signal frequency and said final output signal frequency, said frequency comparison means responsive to the input signal and the second difference signal for providing a second error signal, said second error signal indicative of a frequency difference between said input signal and said second difference signal, said control input signal comprising said second error signal;

means coupling said frequency comparison means to said frequency generating means, said frequency generating means responsive to said control input signal to adjust the frequency of the final output signal, said closed loop frequency synthesizer being stabilized when the frequency of said second difference signal is equal to the frequency of said input signal, the closed loop frequency synthesizer may be stabilized when the final output signal frequency is equal to the sum of the first reference signal frequency and the input signal frequency and when the final output signal frequency is equal to the difference between the first reference signal frequency and the input signal frequency.

2. A closed loop frequency synthesizer as in claim 1 wherein said first reference signal comprises at least one group of three predetermined, selectable frequencies, the three frequencies in each group separated by said lower frequency.

3. A closed loop frequency synthesizer as in claim 1 wherein said first reference signal comprises at least two groups of three predetermined, selectable frequencies, the three frequencies in each group separated by said lower frequency, the center frequency of each group separated from the center frequency of the next higher frequency group by six times said lower frequency, said FM reference signal having a frequency three times said lower frequency.

4. A closed loop frequency synthesizer as in claim 3 wherein said second signal source comprises a plurality of selectable high-Q resonant signal sources.

5. A closed loop frequency synthesizer as in claim 4 wherein said first signal source comprises a third phase-locked loop.

6. A closed loop frequency synthesizer as in claim 5 wherein said upper frequency is equal to two times said lower frequency.

7. A tunable frequency signal generator comprising:

a first phase-locked loop including a first voltage controlled oscillator having a control input and an output, a first frequency mixing means having an output and first and second inputs, said first input coupled to said first voltage controlled oscillator output, and a first phase detector having an output and first and second inputs, the first input of said first phase detector coupled to the output of said first frequency mixing means, the output of said first phase detector coupled to the control input of said first voltage controlled oscillator, said first voltage controlled oscillator responsive to a first error signal for providing a final output signal having a frequency tunable over an output frequency range at said output of the first voltage controlled oscillator;

a second phase-locked loop coupled to said second input of said first frequency mixing means, said second phase-locked loop including a second voltage controlled oscillator for providing a first reference signal, second frequency mixing means having an output and first and second inputs, said first input of the second frequency mixing means coupled to said second voltage controlled oscillator, and a second phase detector having an output and first and second inputs, said output of the second phase detector coupled to said second voltage controlled oscillator, said first input of the second phase detector coupled to said output of the second frequency mixing means, a third phase-locked loop coupled to said seocnd input of the second phase detector, said third phase-locked loop for providing an FM reference signal having a predetermined frequency, a signal source means coupled to said second input of the second frequency mixing means, said signal source means for providing a second reference signal having a plurality of predetermined, selectable frequencies, said second frequency mixing means responsive to the first reference signal and the second reference signal to provide a first different signal, said first difference signal having a frequency equal to the difference between the first reference signal frequency and the second reference signal frequency, said second phase detector responsive to the FM reference signal and the first difference signal to provide a second error signal, said second error signal indicative of a phase difference between the FM reference signal and the first difference signal, said second voltage controlled oscillator responsive to said second error signal to adjust the frequency of the first reference signal, the second phase-locked loop being stabilized when said first difference frequency is equal to the FM reference signal frequency, said second phase-locked loop may be stabilized when the first reference signal frequency is equal to the sum of the FM reference signal frequency and the second reference signal frequency, and also when the first reference signal frequency is equal to the difference between the second reference signal frequency and the FM reference signal frequency;

a fourth phase-locked loop coupled to said second input of the first phase detector for providing an input signal having a multiplicity of frequencies, said multiplicity of frequencies being rational multiples of a third reference signal frequency, said multiplicity of frequencies selectable over an input frequency range, said input frequency range defined by a lower frequency and an upper frequency;

said first frequency mixing means responsive to the first reference signal and the final output signal for providing a second difference signal having a frequency equal to the difference between the first reference signal frequency and the final output signal frequency, said first phase detector responsive to the input signal and the second difference signal for providing a second error signal, said second error signal indicative of a phase difference between the input signal and the second difference signal, said first voltage controlled oscillator responsive to the second error signal to adjust the frequency of the final output signal, said first phase-locked loop being stabilized when the frequency of the second difference signal is equal to the frequency of the input signal, the first phase-locked loop may be stabilized when the final output frequency is equal to the sum of the first reference signal frequency and the input signal frequency and when the final output frequency is equal to the difference between the first reference signal frequency and the input signal frequency.

8. A tunable frequency signal generator as in claim 7 wherein said first reference signal comprises at least one group of three predetermined, selectable frequencies, the three frequencies in each group separated by said lower frequency.

9. A tunable frequency signal generator as in claim 7 wherein said first reference signal comprises at least two groups of three predetermined, selectable frequencies, the three frequencies in each group separated by said lower frequency, the center frequency of each group separated from the center frequency of the next higher frequency group by six times said lower frequency, said FM reference frequency having a frequency three times said lower frequency.

10. A tunable frequency signal generator as in claim 9 wherein said signal source means comprises a plurality of selectable high-Q resonant signal sources.

11. A tunable frequency signal generator as in claim 10 wherein said third phase-locked loop includes input means coupling modulation signals to said third phase-locked loop, said third phase-locked loop responsive to said modulation signals for providing frequency and phase modulation of the FM reference signal.

12. A tunable frequency signal generator as in claim 11 wherein each of said plurality of high-Q resonant signal sources comprise a surface acoustic wave resonator oscillator.

13. A tunable frequency signal generator as in claim 12 wherein said plurality of surface acoustic wave resonator oscillators comprise three surface acoustic wave resonator oscillators.

14. A tunable frequency signal generator as in claim 13 wherein said upper frequency is equal to two times said lower frequency.

* * * * *

UNITED STATES PATENT AND TRADEMARK OFFICE
CERTIFICATE OF CORRECTION

PATENT NO. : 4,603,304

DATED : July 29, 1986

INVENTOR(S) : Robert E. Burns et al

It is certified that error appears in the above—identified patent and that said Letters Patent are hereby corrected as shown below:

Column 1, line 50 of the Patent, delete the equation "$F_{ref} \leq (f_b 31 f_a)$" and insert --$F_{ref} \leq (f_b - f_a)$--.

Signed and Sealed this

Twenty-fourth Day of February, 1987

*Attest:*

DONALD J. QUIGG

*Attesting Officer*   *Commissioner of Patents and Trademarks*